(12) United States Patent
Zhu et al.

(10) Patent No.: US 12,316,078 B2
(45) Date of Patent: May 27, 2025

(54) MODE-DISCRIMINATING EMITTER DEVICE WITH AN ACTIVE EMITTER AND A PASSIVE EMITTER

(71) Applicant: Lumentum Operations LLC, San Jose, CA (US)

(72) Inventors: Yeyu Zhu, San Jose, CA (US); Chien-Yao Lu, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 567 days.

(21) Appl. No.: 17/654,655

(22) Filed: Mar. 14, 2022

(65) Prior Publication Data
US 2023/0238778 A1    Jul. 27, 2023

Related U.S. Application Data (60) Provisional application No. 63/302,369, filed on Jan. 24, 2022.

(51) Int. Cl.
| | |
|---|---|
| *H01S 5/42* | (2006.01) |
| *H01S 5/02335* | (2021.01) |
| *H01S 5/026* | (2006.01) |
| *H01S 5/183* | (2006.01) |

(52) U.S. Cl.
CPC .......... *H01S 5/423* (2013.01); *H01S 5/02335* (2021.01); *H01S 5/026* (2013.01); *H01S 5/18311* (2013.01); *H01S 5/18347* (2013.01)

(58) Field of Classification Search
CPC ...... H01S 5/423; H01S 5/02335; H01S 5/026; H01S 5/18311; H01S 5/18347; H01S 5/142; H01S 5/18338; H01S 5/0282; H01S 5/18308; H01S 5/1833; H01S 5/18369;

(Continued)

(56) References Cited

U.S. PATENT DOCUMENTS

| | | | |
|---|---|---|---|
| 7,535,944 B1* | 5/2009 | Guilfoyle | H01S 5/423 |
| | | | 372/108 |
| 2019/0067906 A1* | 2/2019 | Yuen | H01S 5/18333 |
| 2019/0181609 A1* | 6/2019 | Yuen | H01S 5/1833 |

OTHER PUBLICATIONS

H. R. Ibrahim et al. "Modelling and characterisation of the noise characteristics of the vertical cavity surface-emitting lasers subject to slow light feedback." Pramana—J Phys 93, 73 (2019) (Year: 2019).*

(Continued)

*Primary Examiner* — Xinning(Tom) Niu
(74) *Attorney, Agent, or Firm* — Harrity & Harrity, LLP (57) ABSTRACT

In some implementations, a vertical cavity surface emitting laser (VCSEL) device includes a substrate layer and a set of epitaxial layers disposed on the substrate layer. The VCSEL device may include an active VCSEL formed in the set of epitaxial layers, where the active VCSEL is configured such that electrical pumping that provides optical gain for lasing is to be present in the active VCSEL. The VCSEL device may include at least one passive VCSEL formed in the set of epitaxial layers, where the passive VCSEL is configured such that electrical pumping that provides optical gain for lasing is to be absent in the at least one passive VCSEL. The at least one passive VCSEL may be positioned relative to the active VCSEL to cause coupling of one or more modes of the active VCSEL with one or more modes of the at least one passive VCSEL.

20 Claims, 6 Drawing Sheets

(58) Field of Classification Search
CPC ............... H01S 5/18394; H01S 5/2063; H01S 2301/16; H01S 2301/176
See application file for complete search history.

(56) References Cited

OTHER PUBLICATIONS

M. Ahmed, "Modeling of generating ultra-high frequency oscillations in VCSEL integrated with cascaded transverse coupled cavities.", Appl. Phys. B 126, 170 (2020) (Year: 2020).*

* cited by examiner

MODE-DISCRIMINATING EMITTER DEVICE WITH AN ACTIVE EMITTER AND A PASSIVE EMITTER

CROSS-REFERENCE TO RELATED APPLICATION

This patent application claims priority to U.S. Provisional Patent Application No. 63/302,369, filed on Jan. 24, 2022, and entitled "INCREASED MODAL DISCRIMINATION IN VERTICAL CAVITY SURFACE EMITTING LASER DEVICES." The disclosure of the prior application is considered part of and is incorporated by reference into this patent application.

TECHNICAL FIELD

The present disclosure relates generally to vertical cavity surface emitting lasers (VCSELs) and to a mode-discriminating emitter device with an active emitter and a passive emitter.

BACKGROUND

A vertical-emitting device, such as a VCSEL, may include a laser, an optical transmitter, or the like, in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

In some implementations, a VCSEL device includes a substrate layer and a set of epitaxial layers disposed on the substrate layer. The VCSEL device may include an active VCSEL formed in the set of epitaxial layers, where the active VCSEL is configured such that electrical pumping that provides optical gain for lasing is to be present in the active VCSEL. The VCSEL device may include at least one passive VCSEL formed in the set of epitaxial layers, where the passive VCSEL is configured such that electrical pumping that provides optical gain for lasing is to be absent in the at least one passive VCSEL. The at least one passive VCSEL may be positioned relative to the active VCSEL to cause coupling of one or more modes of the active VCSEL with one or more modes of the at least one passive VCSEL.

In some implementations, an emitter device includes a substrate layer and a set of epitaxial layers disposed on the substrate layer. The emitter device may include an active emitter formed in the set of epitaxial layers, where the active emitter is configured such that electrical pumping that provides optical gain for lasing is to be present in the active emitter. The emitter device may include at least one passive emitter formed in the set of epitaxial layers, where the passive emitter is configured such that electrical pumping that provides optical gain for lasing is to be absent in the at least one passive emitter. The at least one passive emitter may cause coupling of one or more modes of the active emitter with one or more modes of the at least one passive emitter.

In some implementations, a method includes connecting, to an electrical power source, an emitter device that includes a substrate layer, a set of epitaxial layers disposed on the substrate layer, an active emitter formed in the set of epitaxial layers, and at least one passive emitter formed in the set of epitaxial layers; and injecting an electrical current to the emitter device to cause electrical pumping, that provides optical gain for lasing, of the active emitter without causing electrical pumping, that provides optical gain for lasing, of the at least one passive emitter.

DETAILED DESCRIPTION

The following detailed description of example implementations refers to the accompanying drawings. The same reference numbers in different drawings may identify the same or similar elements.

Mode competition within a vertical cavity surface emitting laser (VCSEL) device affects an intensity noise, a phase noise, a beam quality, and/or a side mode suppression ratio (SMSR), among other examples, of the VCSEL device. In some cases, a VCSEL device may employ a small oxidation aperture to reduce a number of modes of the VCSEL device, but this may result in a high threshold current density and/or a high power density of the VCSEL device, thereby inducing a lower differential gain and/or impacting performance reliability of the VCSEL device. Moreover, in order to reduce a number of modes in a VCSEL device with a large oxidation aperture (OA) to achieve acceptable laser performance, modal discrimination among different modes (i.e., modal loss differences between different modes) should be increased so that relatively fewer modes can be excited.

Current VCSEL devices do not achieve such high modal discrimination. Rather, modal discrimination between modes supported in a VCSEL device is generally small. Thus, a relatively large number of modes (e.g., all modes) supported by a VCSEL device may reach a lasing threshold, thereby resulting in multi-mode lasing. Multi-mode operation of a VCSEL device results in strong mode competition and other instabilities, as described above. Moreover, mode volume in a VCSEL device should be reduced to increase a laser modulation bandwidth. Thus, multi-mode operation of a VCSEL device impacts signal modulation performance.

Some implementations described herein provide an emitter device that includes an active emitter and one or more passive emitters positioned adjacent to (e.g., next to or around) the active emitter (e.g., the emitter device is a composite emitter device). For example, the active emitter and the one or more passive emitters may be formed in the same set of epitaxial layers, and the one or more passive emitters may be positioned relative to the active emitter such that one or more modes of the active emitter couple with one or more modes of the one or more passive emitters.

A pump current may be injected into the active emitter to provide an optical gain, while optical losses are introduced by the one or more passive emitters (e.g., the one or more passive emitters are not electrically pumped). Thus, the one or more passive emitters provide dissipative (e.g., lossy) modes that may phase match and couple with higher-order modes of the active emitter, thereby absorbing overlapping optical energies. In this way, the higher-order modes of the active emitter are effectively filtered out. Moreover, by manipulating the pump current for the active emitter as well as the coupling strength between modes of the emitters (e.g., based on the distance between emitters), undesired higher-order modes may be suppressed while lower-order modes are not affected. Thus, the VCSEL device provides increased modal discrimination. In this way, undesired high-order modes of the active emitter are suppressed below a lasing threshold, and lasing of the active emitter occurs with the lower-order modes. Moreover, an emitting aperture of the active emitter may be increased due to suppression of the higher-order modes. Accordingly, an intensity noise, a phase noise, a beam quality, and/or an SMSR, among other examples, of the emitter device may be optimized.

Figure 1A:
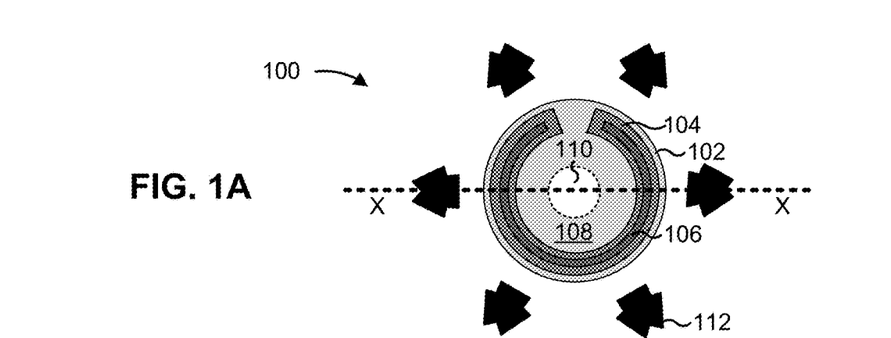
FIGS. 1A and 1B are diagrams illustrating a top view of an example emitter, and a cross-sectional view of the example emitter along the line X-X, respectively.
Figure 1B:
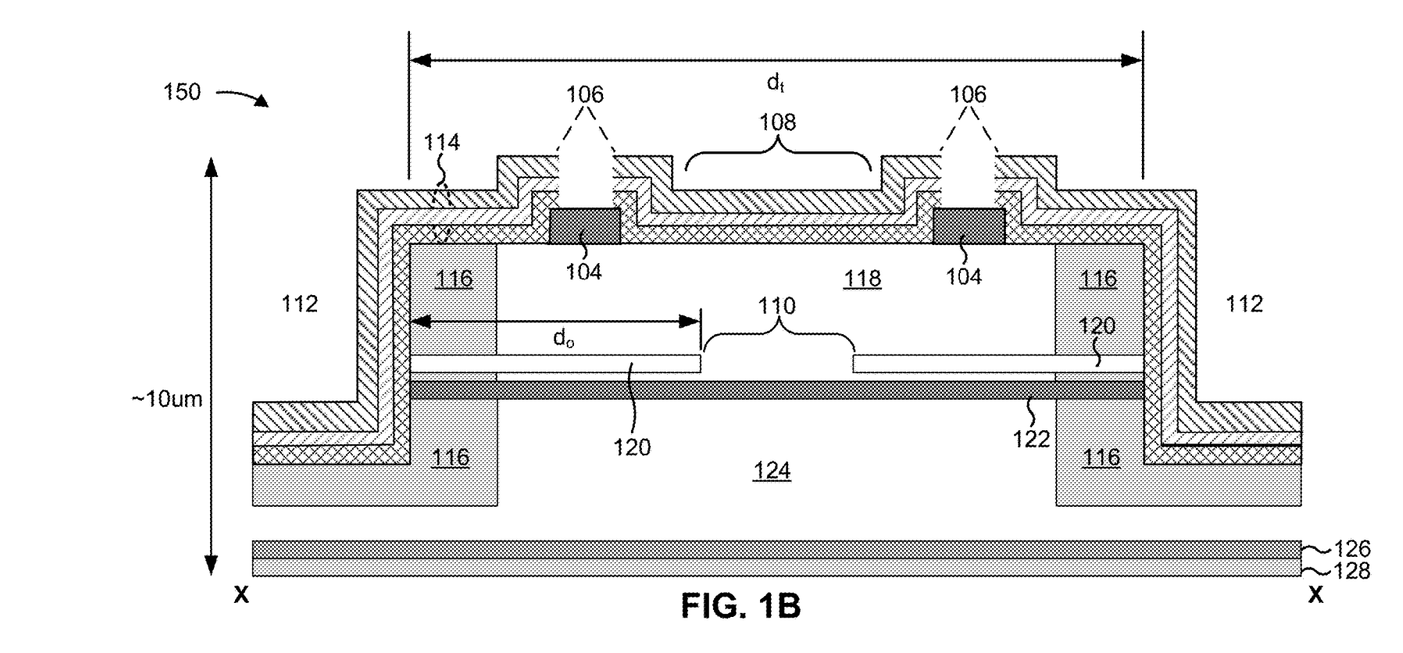

FIGS. 1A and 1B are diagrams illustrating a top view of an example emitter 100, and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g., a dielectric layer or a passivation layer) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxidation aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The number and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, or another quantity of trenches. In some implementations, trench 112 may encircle emitter 100 to form a mesa structure $d_t$. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, and/or emission profile. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g., a dielectric passivation/mirror layer), and an ohmic metal layer 104. As shown, emitter 100 may have, for example, a total height that is approximately 10 µm.

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a GaAs layer, an InP layer, and/or another type of semiconductor layer.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100.

In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. Current confinement aperture 110 may provide confinement of current injected to emitter 100 as well as confinement of optical energy of emitter 100. A size of current confinement aperture 110 may be greater than 2 μm in diameter, thereby supporting multiple modes in emitter 100. For example, a size of current confinement aperture 110 may range from approximately 4 μm to approximately 20 μm in diameter. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxidation aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The number, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 1C:
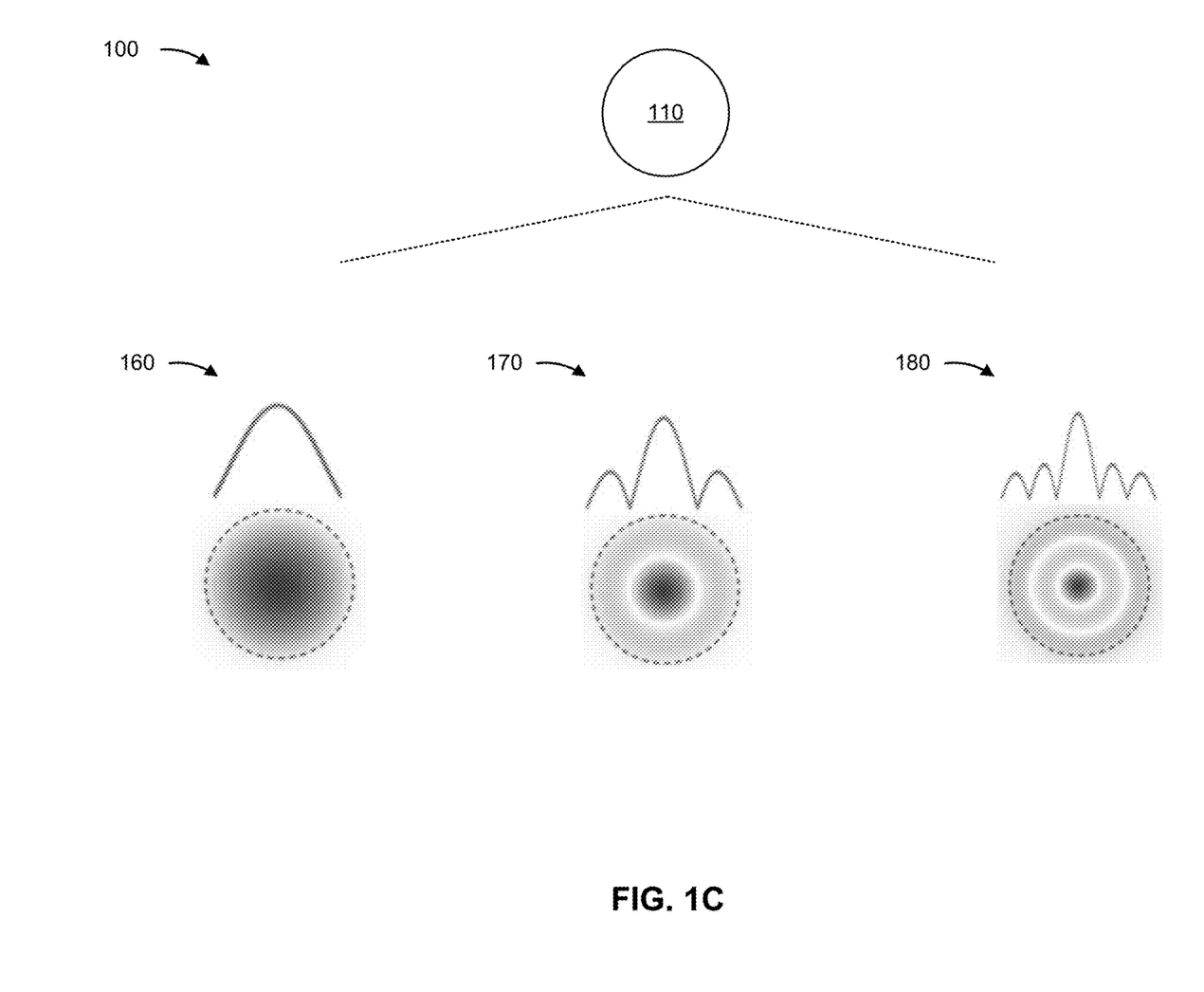
FIG. 1C is a diagram illustrating examples of modes supported by the example emitter of FIGS. 1A and 1B.

FIG. 1C is a diagram illustrating examples 160, 170, and 180 of modes supported by emitter 100. In particular, FIG. 1C shows modes supported within an emitting region of emitter 100. The emitting region may correspond to current confinement aperture 110 (e.g., oxidation aperture) of emitter 100. The emitting region may represent a current injection area of emitter 100. The modes of examples 160, 170, and 180 are shown with respect to a circular emitting region. However, as described herein, other shapes for the emitting region are contemplated.

In example 160, the mode is a fundamental mode (e.g., a lowest-order mode) supported by emitter 100 (e.g., having a circular-shaped emitting region). As shown, the fundamental mode may have an intensity profile that is approximately Gaussian-shaped. In addition to the fundamental mode, other modes may be supported by emitter 100. In particular, emitter 100 may support the modes of examples 170 and 180, which are higher-order modes. As shown, intensity profiles of the higher-order modes may be more complicated relative to the intensity profile of the fundamental mode. Emitter 100 may support other higher-order modes in addition or alternatively to the higher-order modes of examples 170 and 180.

As can be seen in FIG. 1C, the higher-order modes have a higher intensity distribution near an outer region of the emitting region and are less confined than the fundamental mode (or other lower-order modes). Moreover, a volume of higher-order modes supported by emitter 100 may be greater than a volume of lower-order modes (e.g., the fundamental mode) supported by emitter 100. Thus, reducing the volume of higher-order modes may provide increased laser modulation bandwidth, as described herein.

As indicated above, FIG. 1C is provided as an example. Other examples may differ from what is described with regard to FIG. 1C.

Figure 2:
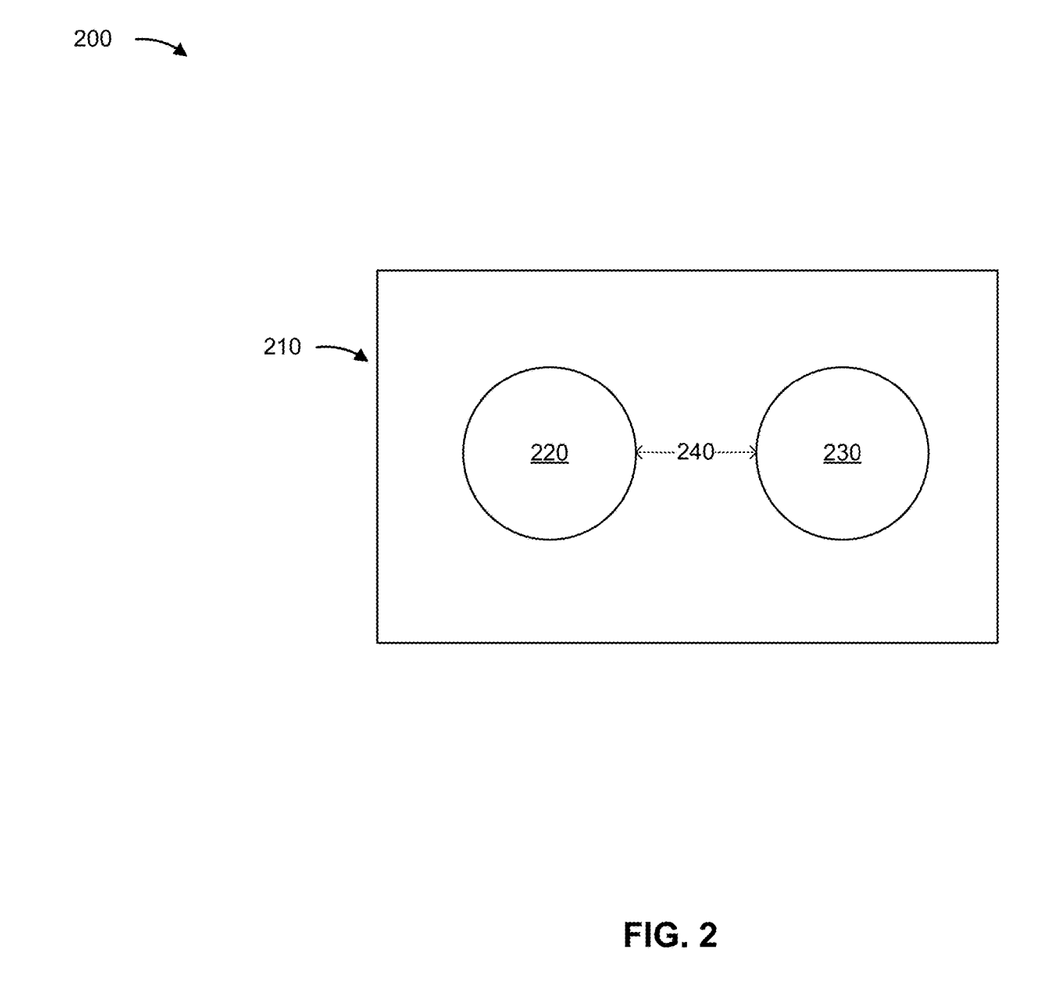
FIG. 2 is a diagram of an example emitter device.

FIG. 2 is a diagram of an example emitter device 200 (shown as a top view). The emitter device 200 may be a VCSEL device. As shown in FIG. 2, the emitter device 200 may include a set of epitaxial layers 210, as described in connection with FIGS. 1A and 1B. For example, the set of epitaxial layers 210 may include an active region between a first mirror (e.g., a first DBR) and a second mirror (e.g., a second DBR). The set of epitaxial layers 210 may be disposed on (e.g., grown on) a substrate (not shown in FIG. 2), as described in connection with FIGS. 1A and 1B.

The emitter device 200 may include an active emitter 220 (e.g., a first emitter) and at least one passive emitter 230 (e.g., at least one second emitter). The active emitter 220 and/or the at least one passive emitter 230 may be, or may be similar to, emitter 100. The active emitter 220 and the at least one passive emitter 230 may be VCSELs.

The active emitter 220 (e.g., an emitter cavity, such as a VCSEL cavity) may be formed in the set of epitaxial layers 210. For example, the active emitter 220 may be defined by an emitting region (e.g., an oxidation aperture) in the set of epitaxial layers 210. The active emitter 220 may be configured such that electrical pumping that provides optical gain for lasing is to be present in the active emitter 220 (e.g., in use, the active emitter 220 is electrically pumped to provide optical gain for lasing). In other words, the active emitter 220 may be configured such that current injection to the emitter device 200 causes electrical pumping of the active emitter 220 sufficient to provide optical gain for lasing. For example, the active emitter 220 may include an electrical contact (e.g., an ohmic metal layer), as described in connection with FIGS. 1A and 1B, configured for injecting current to the active emitter 220.

The at least one passive emitter 230 (e.g., at least one emitter cavity, such as at least one VCSEL cavity) also may be formed in the set of epitaxial layers 210. For example, the passive emitter 230 may be defined by an emitting region (e.g., oxidation aperture) in the set of epitaxial layers 210. Thus, the active emitter 220 and the at least one passive emitter 230 may be formed in the same set of epitaxial layers 210. Moreover, the active emitter 220 and the at least one passive emitter 230 may be structurally identical (e.g., as a result of being formed in the same set of epitaxial layers 210). Additionally, a plurality of modes of the at least one passive emitter 230 may be associated with propagation constant values that match (e.g., that are equivalent to or that are within a tolerance of, such as within 1% of) propagation constant values associated with a plurality of modes of the active emitter 220. In some implementations, the plurality of modes of the at least one passive emitter 230 may phase match with the plurality of modes of the active emitter 220. Additionally, or alternatively, the plurality of modes of the at least one passive emitter 230 may be associated with respective intensity profiles that match with respective intensity profiles of the plurality of modes of the active emitter 220. Thus, the at least one passive emitter 230 may be referred to as a "partner" to the active emitter 220 and/or the at least one passive emitter 230 and the active emitter 220 may be referred to as an "emitter pair."

The at least one passive emitter 230 may be configured such that electrical pumping that provides optical gain for lasing is to be absent in the at least one passive emitter 230 (e.g., in use, the at least one passive emitter 230 is not electrically pumped and provides loss in the emitter device 200). In other words, the at least one passive emitter 230 may be configured such that current injection to the emitter device 200 does not cause electrical pumping of the at least one passive emitter 230 sufficient to provide optical gain for lasing (though some electrical pumping may occur). For example, the at least one passive emitter 230 may lack an electrical contact configured for injecting current to the at least one passive emitter 220. As another example, the at least one passive emitter 230 may include the metal contact, and the at least one passive emitter 230 may further include an implant region, similar to the implant region described in connection with FIGS. 1A and 1B, configured to disrupt (e.g., prevent, reduce, or the like) current injection to the at least one passive emitter 230 such that electrical pumping of the at least one passive emitter 230 sufficient to provide optical gain for lasing does not occur.

The at least one passive emitter 230 may be positioned adjacent to the active emitter 220 (e.g., there are no other emitters between the at least one passive emitter 230 and the active emitter 220). In some implementations, the at least one passive emitter 230 may be positioned relative to the active emitter 220 to cause coupling of one or more modes of the active emitter 220 with one or more modes of the at least one passive emitter 230. The one or more modes of the active emitter 220 that are coupled may include at least one higher-order mode (e.g., multiple higher-order modes) of the active emitter 220. However, the one or more modes of the active emitter 220 that are coupled may not include a fundamental mode of the active emitter 220 (or one or more other lower-order modes of the active emitter 220).

For example, the at least one passive emitter 230 may be positioned a distance 240 from the active emitter 220 that may cause coupling of at least one higher-order mode of the active emitter 220 with the one or more modes of the at least one passive emitter 230 without coupling the fundamental mode of the active emitter 220 (or one or more other lower-order modes of the active emitter 220) with the one or more modes of the at least one passive emitter 230. As another example, a shape of an emitting region(s) (e.g., an oxidation aperture) of the at least one passive emitter 230 relative to a shape of an emitting region (e.g., an oxidation aperture) of the active emitter 220 may cause coupling of at least one higher-order mode of the active emitter 220 with the one or more modes of the at least one passive emitter 230 without coupling the fundamental mode of the active emitter 220 (or one or more other lower-order modes of the active emitter 220) with the one or more modes of the at least one passive emitter 230. In some implementations, the emitting region of the active emitter 220 is the same shape as the emitting region(s) of the at least one passive emitter 230. In some implementations, the emitting region of the active emitter 220 is a different shape from the emitting region(s) of the at least one passive emitter 230.

In a weakly-coupled waveguide system, the coupling strength between two modes may be based on a coupling coefficient and/or phase detuning (e.g., a difference in propagation constants). As described herein, higher-order modes may have a higher intensity distribution near an outer region of an emitting region and are less confined than a fundamental mode or other lower-order modes. Accordingly, a coupling coefficient in the emitter device 200 may be controlled (e.g., by controlling the distance 240) such that the intensity distributions of higher-order modes have a larger spatial overlap than lower-order modes. Moreover, higher-order modes may have larger coupling coefficients than lower-order modes. Thus, because the at least one passive emitter 230 may be phase matched with the higher-order modes in the active emitter 220, the higher-order modes experience higher modal loss, thereby increasing lasing thresholds associated with the higher-order modes (e.g., losses among the plurality of modes of the active emitter 220 are non-uniform). Further, lower-order modes (e.g., the fundamental mode) of the active emitter 220, which are decoupled from the at least one passive emitter 230, maintain relatively lower lasing thresholds, and in mode competition, are the dominant lasing mode. In this way, the emitter device 200 enhances modal discrimination, thereby suppressing undesired higher-order modes (e.g., transverse modes) and facilitating lasing with reduced mode volume using a large emitting region (e.g., a large oxidation aperture).

As described herein, the emitter device 200 may be a VCSEL device. The description herein may be applicable to various VCSEL architectures, such as an oxide-confined architecture, an implant-only architecture, a mesa-type architecture, or the like. Moreover, the description herein is applicable across different emission wavelengths (e.g., from 900 nanometers (nm) to 1550 nm) and/or across different material systems (e.g., a material system using a GaAs substrate, a material system using an InP substrate, or the like). Furthermore, the description herein is applicable to both top-emitting devices and bottom-emitting devices. In some implementations, the techniques and devices described herein may be used to provide light polarization control.

As indicated above, FIG. 2 is provided as an example. Other examples may differ from what is described with regard to FIG. 2.

Figure 3:
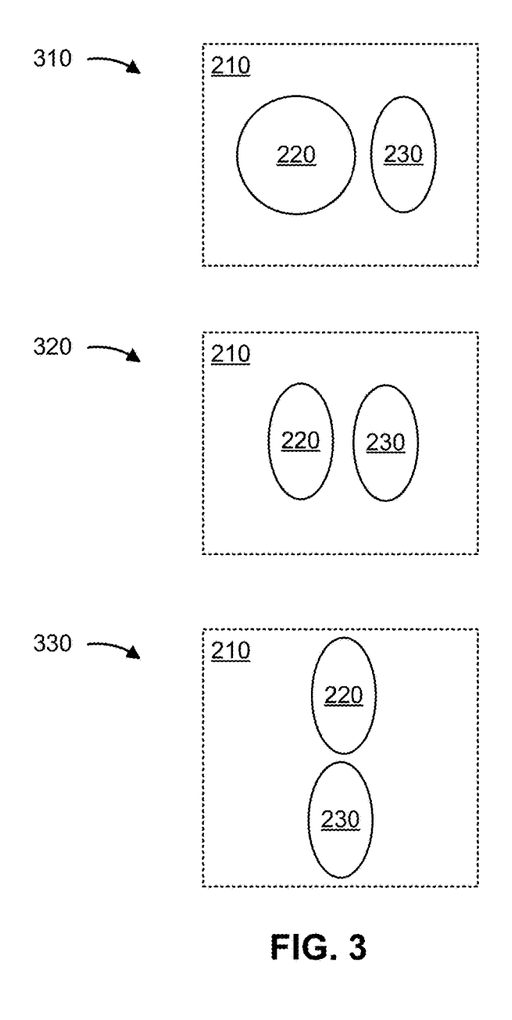
FIG. 3 is a diagram of examples of configurations for an active emitter and a passive emitter of the emitter device of FIG. 2.

FIG. 3 is a diagram of examples 310, 320, and 330 of configurations for an active emitter 220 and a passive emitter 230 of emitter device 200 (shown as top views). As described herein, the relative positions, shapes, and/or distance between the active emitter 220 and the passive emitter 230 may define an extent of coupling of modes of the active emitter 220 and the passive emitter 230. Thus, these parameters can be adjusted to cause coupling of higher-order modes of the active emitter 220 with modes of the passive emitter 230 without coupling lower-order modes of the active emitter 220 with modes of the passive emitter 230.

In example 310, the active emitter 220 may have an emitting region (e.g., an oxidation aperture) that is circular in shape, and the passive emitter 230 may have an emitting region (e.g., an oxidation aperture) that is elliptical in shape. Moreover, the active emitter 220 and the passive emitter 230 may be relatively positioned (e.g., in the set of epitaxial layers 210) such that a minor axis of the elliptically-shaped passive emitter 230 aligns with an axis of symmetry (e.g., one axis of symmetry) of the circular-shaped active emitter 220.

In example 320, the active emitter 220 may have an emitting region (e.g., an oxidation aperture) that is elliptical in shape, and the passive emitter 230 may have an emitting region (e.g., an oxidation aperture) that is elliptical in shape. Moreover, the active emitter 220 and the passive emitter 230 may be relatively positioned (e.g., in the set of epitaxial layers 210) such that a minor axis of the elliptically-shaped passive emitter 230 aligns with a minor axis of the elliptically-shaped active emitter 220.

In example 330, the active emitter 220 may have an emitting region (e.g., an oxidation aperture) that is elliptical in shape, and the passive emitter 230 may have an emitting region (e.g., an oxidation aperture) that is elliptical in shape. Moreover, the active emitter 220 and the passive emitter 230 may be relatively positioned (e.g., in the set of epitaxial layers 210) such that a major axis of the elliptically-shaped passive emitter 230 aligns with a major axis of the elliptically-shaped active emitter 220.

As indicated above, FIG. 3 is provided as an example. Other examples may differ from what is described with regard to FIG. 3.

Figure 4:
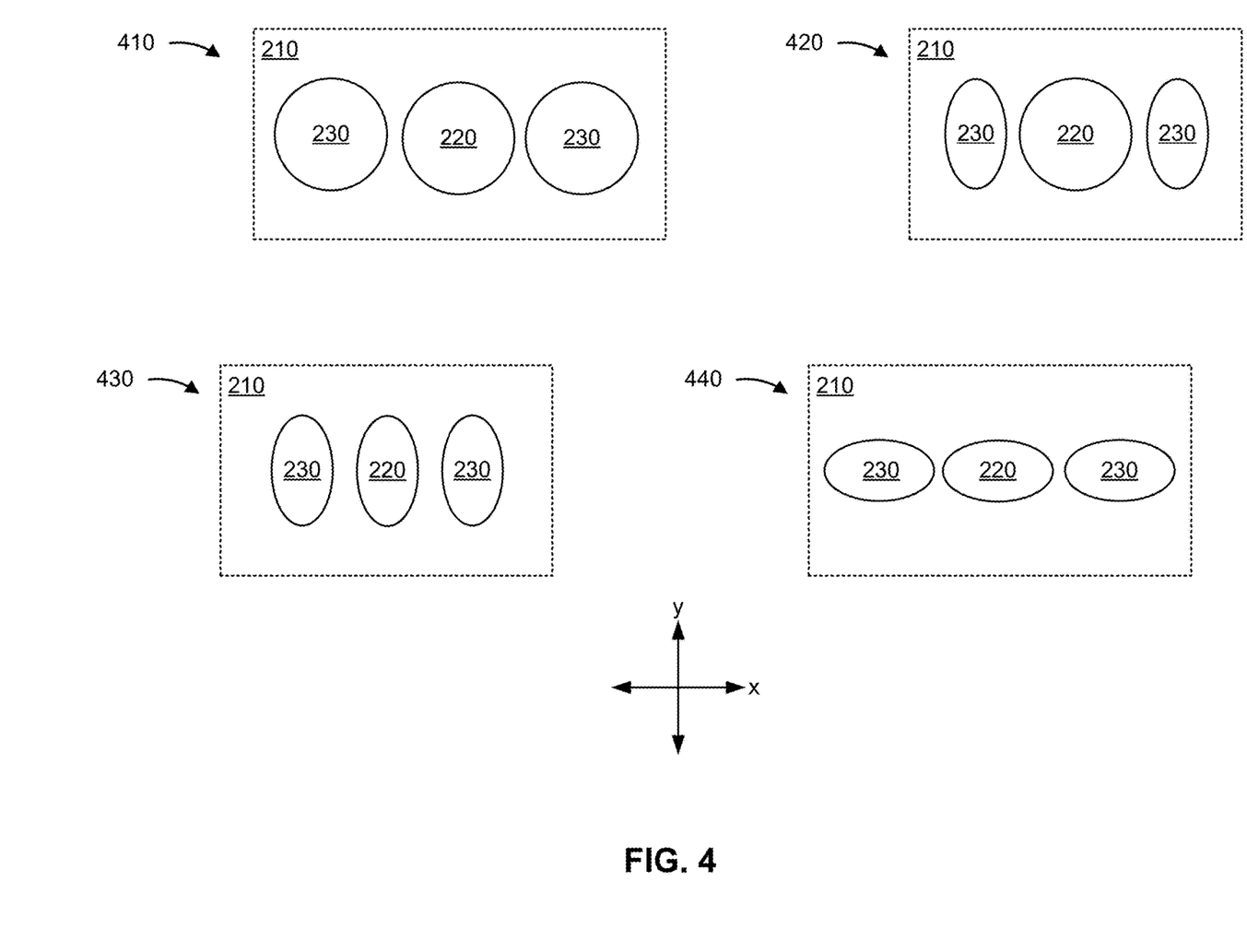
FIG. 4 is a diagram of examples of configurations for an active emitter and multiple passive emitters of the emitter device of FIG. 2.

FIG. 4 is a diagram of examples 410, 420, 430, and 440 of configurations for an active emitter 220 and multiple passive emitters 230 of emitter device 200 (shown as top views). As described herein, the relative positions, shapes, and/or distances between the active emitter 220 and the multiple passive emitters 230 may define an extent of coupling of modes of the active emitter 220 and the multiple passive emitters 230.

In example 410, the active emitter 220 may have an emitting region (e.g., an oxidation aperture) that is circular in shape, and the multiple passive emitters 230 may have emitting regions (e.g., oxidation apertures) that are circular in shape. Moreover, the active emitter 220 and the multiple passive emitters 230 may be relatively positioned (e.g., in the set of epitaxial layers 210) such that the active emitter 220 is between the multiple passive emitters 230, and axes of symmetry of the multiple circular-shaped passive emitters 230 align with an axis of symmetry (e.g., one axis of symmetry) of the circular-shaped active emitter 220.

In example 420, the active emitter 220 may have an emitting region (e.g., an oxidation aperture) that is circular in shape, and the multiple passive emitters 230 may have emitting regions (e.g., oxidation apertures) that are elliptical in shape. Moreover, the active emitter 220 and the multiple passive emitters 230 may be relatively positioned (e.g., in the set of epitaxial layers 210) such that the active emitter 220 is between the multiple passive emitters 230, and minor axes of the multiple elliptical-shaped passive emitters 230 align with an axis of symmetry (e.g., one axis of symmetry) of the circular-shaped active emitter 220.

In example 430, the active emitter 220 may have an emitting region (e.g., an oxidation aperture) that is elliptical in shape, and the multiple passive emitters 230 may have emitting regions (e.g., oxidation apertures) that are elliptical in shape. Moreover, the active emitter 220 and the multiple passive emitters 230 may be relatively positioned (e.g., in the set of epitaxial layers 210) such that the active emitter 220 is between the multiple passive emitters 230, and minor axes of the multiple elliptical-shaped passive emitters 230 align with a minor axis of the elliptical-shaped active emitter 220.

In example 440, the active emitter 220 may have an emitting region (e.g., an oxidation aperture) that is elliptical in shape, and the multiple passive emitters 230 may have emitting regions (e.g., oxidation apertures) that are elliptical in shape. Moreover, the active emitter 220 and the multiple passive emitters 230 may be relatively positioned (e.g., in the set of epitaxial layers 210) such that the active emitter 220 is between the multiple passive emitters 230, and major axes of the multiple elliptical-shaped passive emitters 230 align with a major axis of the elliptical-shaped active emitter 220.

While examples 410, 420, 430, and 440 show the multiple passive emitters 230 as two passive emitters 230, some implementations may include more than two passive emitters 230, such as three passive emitters 230 or four passive emitters 230. Moreover, while examples 410, 420, 430, and 440 show the multiple passive emitters 230 aligning with the active emitter 220 along an x-axis, in some implementations, the multiple passive emitters 230 may align with the active emitter 220 along a y-axis or along a combination of the x-axis and the y-axis. For example, one or more passive emitters 230 may align with the active emitter 220 along the x-axis and one or more passive emitters 230 may align with the active emitter 220 along the y-axis (e.g., in an L-shaped configuration, a cross-shaped configuration, or the like). Furthermore, while examples 410, 420, 430, and 440 show the multiple passive emitters 230 as having the same shape (e.g., the multiple passive emitters 230 are either all circular shaped in an example or all elliptical shaped in an example), in some implementations, the multiple passive emitters 230 may have different shapes. For example, the active emitter 220 may be adjacent to a first passive emitter that is circular in shape and to a second passive emitter that is elliptical in shape.

As indicated above, FIG. 4 is provided as an example. Other examples may differ from what is described with regard to FIG. 4.

Figure 5:
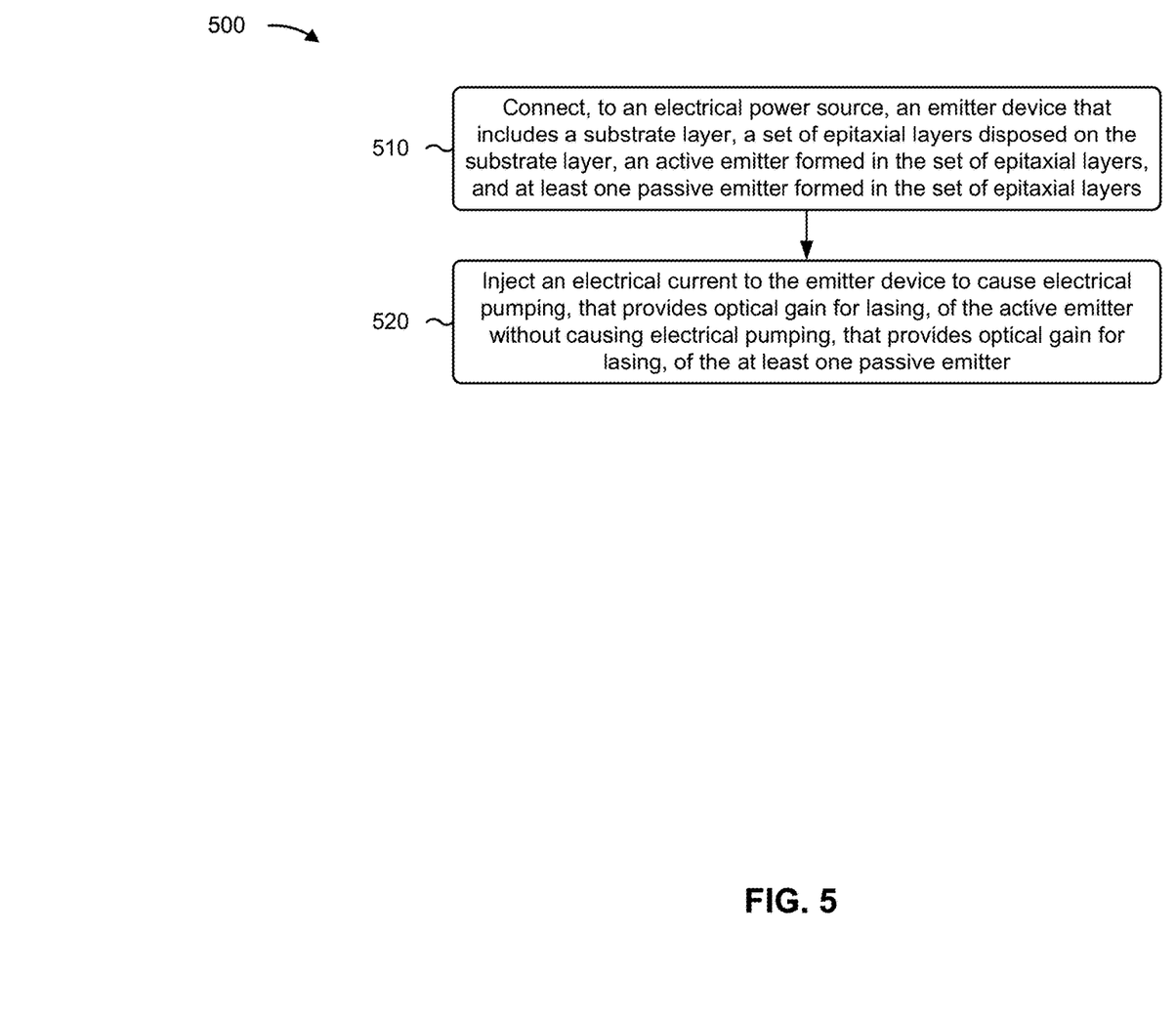
FIG. 5 is a flowchart of an example process associated with mode discrimination for an emitter device.

FIG. 5 is a flowchart of an example process 500 associated with mode discrimination for an emitter device.

As shown in FIG. 5, process 500 may include connecting, to an electrical power source, an emitter device that includes a substrate layer, a set of epitaxial layers disposed on the substrate layer, an active emitter formed in the set of epitaxial layers, and at least one passive emitter formed in the set of epitaxial layers (block 510). For example, the emitter device may be as described herein. As an example, the emitter device may be a VCSEL device, the active emitter may be an active VCSEL, and the at least one passive emitter may be a passive VCSEL, as described herein. The electrical power source may include a battery, an electrical power system, or the like. As further shown in FIG. 5, process 500 may include injecting an electrical current to the emitter device to cause electrical pumping, that provides optical gain for lasing, of the active emitter without causing electrical pumping, that provides optical gain for lasing, of the at least one passive emitter (block 520).

Process 500 may include additional implementations, such as any single implementation or any combination of implementations described below and/or in connection with one or more other processes described elsewhere herein.

In a first implementation, injecting the electrical current is to cause coupling of one or more modes of the active emitter with one or more modes of the at least one passive emitter.

In a second implementation, alone or in combination with the first implementation, the one or more modes of the active emitter include at least one higher-order mode of the active emitter and do not include a fundamental mode of the active emitter.

Although FIG. 5 shows example blocks of process 500, in some implementations, process 500 includes additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A vertical cavity surface emitting laser (VCSEL) device, comprising:
   a substrate layer;
   a set of epitaxial layers disposed on the substrate layer;
   an active VCSEL formed in the set of epitaxial layers,
      wherein the active VCSEL is configured such that electrical pumping that provides optical gain for lasing is to be present in the active VCSEL; and
   at least one passive VCSEL formed in the set of epitaxial layers,
      wherein the passive VCSEL is configured such that electrical pumping that provides optical gain for lasing is to be absent in the at least one passive VCSEL,
      wherein the at least one passive VCSEL is positioned relative to the active VCSEL to cause coupling of one or more modes of the active VCSEL with one or more modes of the at least one passive VCSEL, and
      wherein the one or more modes of the active VCSEL include at least one higher-order mode of the active VCSEL and do not include a fundamental mode of the active VCSEL.

2. The VCSEL device of claim 1, wherein the at least one passive VCSEL is positioned a distance from the active VCSEL that is to cause coupling of the at least one higher-order mode with the one or more modes of the passive VCSEL without coupling the fundamental mode of the active VCSEL with the one or more modes of the passive VCSEL.

3. The VCSEL device of claim 1, wherein a shape of an emitting region of the at least one passive VCSEL relative to a shape of an emitting region of the active VCSEL is to cause coupling of the at least one higher-order mode with the one or more modes of the passive VCSEL without coupling the fundamental mode of the active VCSEL with the one or more modes of the passive VCSEL.

4. The VCSEL device of claim 1, wherein a plurality of modes of the at least one passive VCSEL are associated with propagation constant values that match propagation constant values associated with a plurality of modes of the active VCSEL.

5. The VCSEL device of claim 1, wherein an emitting region of the active VCSEL is a same shape as an emitting region of the at least one passive VCSEL.

6. The VCSEL device of claim 1, wherein an emitting region of the active VCSEL is a different shape from an emitting region of the at least one passive VCSEL.

7. The VCSEL device of claim 1, wherein the at least one passive VCSEL includes multiple passive VCSELs.

8. The VCSEL device of claim 7, wherein the active VCSEL is positioned between a first passive VCSEL of the multiple passive VCSELs and a second passive VCSEL of the multiple passive VCSELs.

9. An emitter device, comprising:
a substrate layer;
a set of epitaxial layers disposed on the substrate layer;
an active emitter formed in the set of epitaxial layers,
  wherein the active emitter is configured such that electrical pumping that provides optical gain for lasing is to be present in the active emitter; and
at least one passive emitter formed in the set of epitaxial layers,
  wherein the passive emitter is configured such that electrical pumping that provides optical gain for lasing is to be absent in the at least one passive emitter,
  wherein the at least one passive emitter is to cause coupling of one or more modes of the active emitter with one or more modes of the at least one passive emitter, and
  wherein the one or more modes of the active emitter include at least one higher-order mode of the active emitter and do not include a fundamental mode of the active emitter.

10. The emitter device of claim 9, wherein an emitting region of the active emitter is circular in shape, and an emitting region of the at least one passive emitter is elliptical in shape.

11. The emitter device of claim 10, wherein the at least one passive emitter is positioned relative to the active emitter such that a minor axis of the emitting region of the at least one passive emitter aligns with an axis of symmetry of the emitting region of the active emitter.

12. The emitter device of claim 9, wherein an emitting region of the active emitter is elliptical in shape, and an emitting region of the at least one passive emitter is elliptical in shape.

13. The emitter device of claim 12, wherein the at least one passive emitter is positioned relative to the active emitter such that a minor axis of the emitting region of the at least one passive emitter aligns with a minor axis of the emitting region of the active emitter.

14. The emitter device of claim 12, wherein the at least one passive emitter is positioned relative to the active emitter such that a major axis of the emitting region of the at least one passive emitter aligns with a major axis of the emitting region of the active emitter.

15. The emitter device of claim 9, wherein a plurality of modes of the at least one passive emitter are associated with propagation constant values that match propagation constant values associated with a plurality of modes of the active emitter.

16. A method, comprising:
connecting, to an electrical power source, an emitter device that includes a substrate layer, a set of epitaxial layers disposed on the substrate layer, an active emitter formed in the set of epitaxial layers, and at least one passive emitter formed in the set of epitaxial layers; and
injecting an electrical current to the emitter device to cause electrical pumping, that provides optical gain for lasing, of the active emitter without causing electrical pumping, that provides optical gain for lasing, of the at least one passive emitter,
  wherein injecting the electrical current is to cause coupling of one or more modes of the active emitter with one or more modes of the at least one passive emitter, and
  wherein the one or more modes of the active emitter include at least one higher-order mode of the active emitter and do not include a fundamental mode of the active emitter.

17. The VCSEL device of claim 1, wherein the at least one higher-order mode has a higher intensity distribution near an outer region of an emitting region and are less confined than the fundamental mode.

18. The emitter device of claim 9, wherein the at least one higher-order mode has a higher intensity distribution near an outer region of an emitting region and are less confined than the fundamental mode.

19. The method of claim 16, wherein the at least one higher-order mode has a higher intensity distribution near an outer region of an emitting region and are less confined than the fundamental mode.

20. The method of claim 16, wherein a plurality of modes of the at least one passive emitter are associated with propagation constant values that match propagation constant values associated with a plurality of modes of the active emitter.

* * * * *